United States Patent
Landau et al.

(10) Patent No.: US 8,097,944 B2
(45) Date of Patent: Jan. 17, 2012

(54) SEMICONDUCTOR DEVICE

(75) Inventors: Stefan Landau, Wehrheim (DE); Ralf Otremba, Kaufbeuren (DE); Uwe Kirchner, Feldkirchen (AT); Andreas Schloegl, Ottobrunn (DE); Christian Fachmann, Fuernitz (AT); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 278 days.

(21) Appl. No.: 12/433,429

(22) Filed: Apr. 30, 2009

(65) Prior Publication Data

US 2010/0276797 A1 Nov. 4, 2010

(51) Int. Cl.
  *H01L 23/48* (2006.01)
  *H01L 23/52* (2006.01)
(52) U.S. Cl. .................. 257/692; 257/706; 438/122

(58) Field of Classification Search .................. 257/692, 257/706, E21.509; 438/121, 122, 124
See application file for complete search history.

(56) References Cited

U.S. PATENT DOCUMENTS

| 6,081,029 A * | 6/2000 | Yamaguchi .................. 257/718 |
| 6,661,087 B2 * | 12/2003 | Wu .............................. 257/692 |
| 6,838,752 B2 * | 1/2005 | Diot ............................ 257/666 |
| 7,858,443 B2 * | 12/2010 | Powell et al. ................ 438/111 |
| 2001/0009302 A1 * | 7/2001 | Murayama et al. ........... 257/704 |
| 2010/0013095 A1 * | 1/2010 | Hada et al. .................... 257/741 |

* cited by examiner

*Primary Examiner* — Phuc Dang
(74) *Attorney, Agent, or Firm* — Dicke, Billig & Czaja, PLLC (57) ABSTRACT

A semiconductor device includes a substrate having a chip island, a chip attached to the chip island, and encapsulation material deposited on the chip and part of the chip island. The chip island includes a first main face to which the chip is attached opposite a second main face, with the second main face of the chip island defining at least one cavity.

15 Claims, 10 Drawing Sheets

SEMICONDUCTOR DEVICE

BACKGROUND

Market demand for smaller and more functional electronic devices has driven the development of semiconductor components, including semiconductor packages, and entire systems disposed on a semiconductor chip.

Surface mount devices provide the desired electronic component(s) and device functionality in a single package. Such surface mount devices are selectively mounted to a printed circuit board, for example by producers of automotive or telecommunication equipment. Typically, a lower electrode of the surface mount device is soldered onto the printed circuit board. The placement of the solder has the potential to undesirably cover more of the surface mount device than desired. In addition, it is desired to control the amount and thickness of the solder because increased solder thickness has the potential to undesirably increase the electrical resistance between the device and the board. Thus, solder placement presents challenges that have the potential to limit the electrical performance of the completed electronic assembly.

Surface mount devices are useful in a wide range of applications, but the difficulty in handling presents economical and electrical challenges. For these and other reasons there is a need for the present invention.

SUMMARY

One aspect provides a semiconductor device including a substrate having a chip island, a chip attached to the chip island, and encapsulation material deposited on the chip and part of the chip island. The chip island includes a first main face to which the chip is attached opposite a second main face, with the second main face of the chip island defining at least one cavity.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited"

are meant to cover literally all kinds and techniques of applying layers onto each other. In one embodiment, they are meant to cover techniques in which layers are applied at once as a whole, in for example, laminating techniques; as well as techniques in which layers are deposited in a sequential manner, in for example, sputtering, plating, molding, chemical vapor deposition (CVD) techniques. One example for a layer to be applied is a redistribution layer (RDL) patterned in electrical connection with contacts of a chip. The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

In some embodiments the semiconductor chips are covered with an encapsulant material. The encapsulant material includes any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, a fan-out of embedded dies is fabricated. The fan-out of embedded dies is arranged in an array having the form of a wafer and is referred to as a "re-configured wafer." However, it should be appreciated that the fan-out of embedded dies is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments provide a surface mount semiconductor device that enables customers to use economical wave soldering to attach the device to a printed circuit board while also realizing the performance advantages of the surface mount device.

Embodiments provide a surface mount semiconductor package including an attachment surface having one or more cavities configured to receive solder material for attachment of the semiconductor package to a circuit board. The cavities formed in the semiconductor device are configured for alignment with one or more through-openings formed in the circuit board. After alignment of the cavities with the through-openings, solder material is flowed through the circuit board into the cavities to form a durable electrical connection between the semiconductor package and the circuit board.

In one embodiment, the device is provided to the purchaser with the cavities at least partially filled with solder material. When the solder material in the cavities is heated during an attachment process, the solder flows to fill the cavities and through-openings (along with additional solder introduced to the through-openings) to ensure complete bonding between the semiconductor package and the circuit board.

Embodiments described herein provide improved electrical performance between the semiconductor package and the circuit board, provide minimized conduction distance to improve electrical performance of high frequency circuits, provide higher switching frequencies with reduced electromagnetic inductance, and ensure electrical connection between the semiconductor package and the circuit board in an economical manner.

Figure 1:
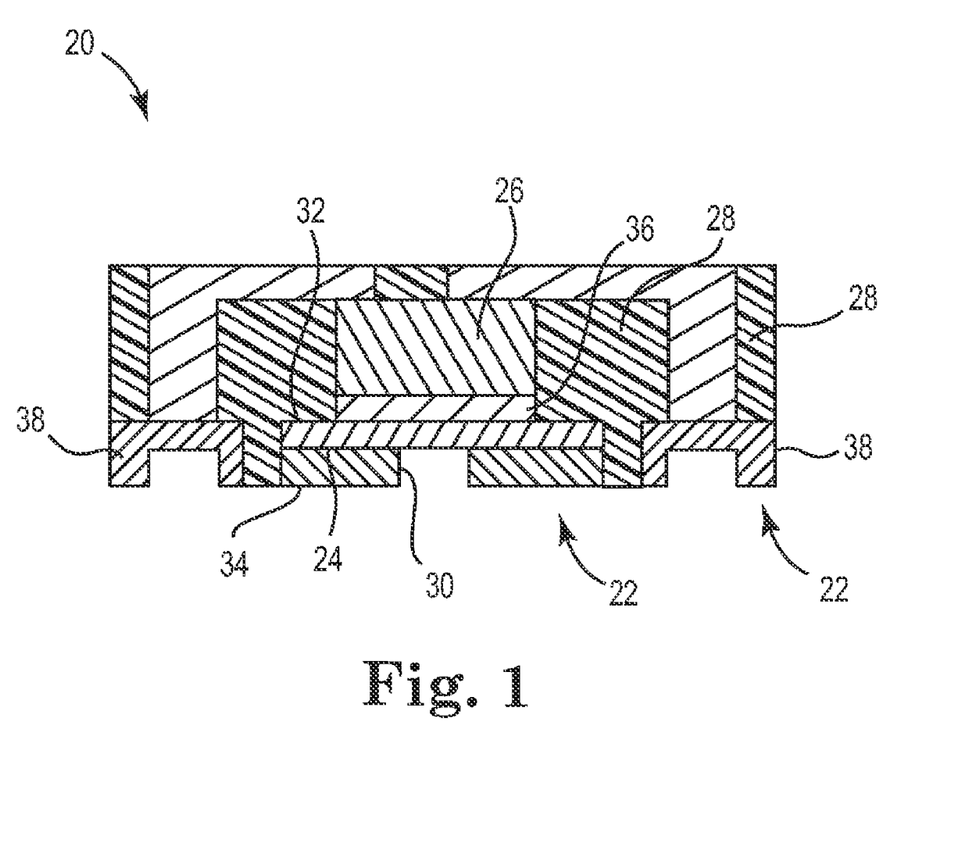
FIG. 1 is a schematic cross-sectional view of a semiconductor device according to one embodiment.

FIG. 1 is a schematic cross-sectional view of a semiconductor device 20 according to one embodiment. Semiconductor device 20 includes a substrate 22 having a chip island 24, a chip 26 connected to chip island 24, encapsulation material 28 deposited on chip 26 and a portion of chip island 24, and a cavity 30 formed in chip island 24.

Suitable substrates for substrate 22 includes metal plates, metal carriers, leadframes, a support formed of a single layer, a support formed of multiple layers in the form of a laminate (for example, alternating layers of epoxy and metal), structured wafer-level substrates, or non-structured substrates.

In one embodiment, substrate 22 is a leadframe 22 and chip island 24 is formed as a portion of leadframe 22 and includes a first main face 32 opposite a second main face 34, where chip 26 is attached to first main face 32 by attachment material 36 and cavity 30 is formed in second main face 34. Suitable leadframes 22 include leaded or non-leaded leadframes. In one embodiment, leadframe 22 is a metal non-leaded leadframe including multiple contact pads 38 disposed around a periphery of chip island 24. Other suitable leadframes are described below.

In one embodiment, an active area of chip 26 is connected to chip island 24 with an electrically conductive attachment material 36. Suitable electrically conductive materials include conductive pastes, epoxies, filled pastes/epoxies, conductive adhesives, and the like.

Suitable encapsulation materials 28 include plastic, epoxy, filled insulators and those encapsulant materials described above.

Figure 2:
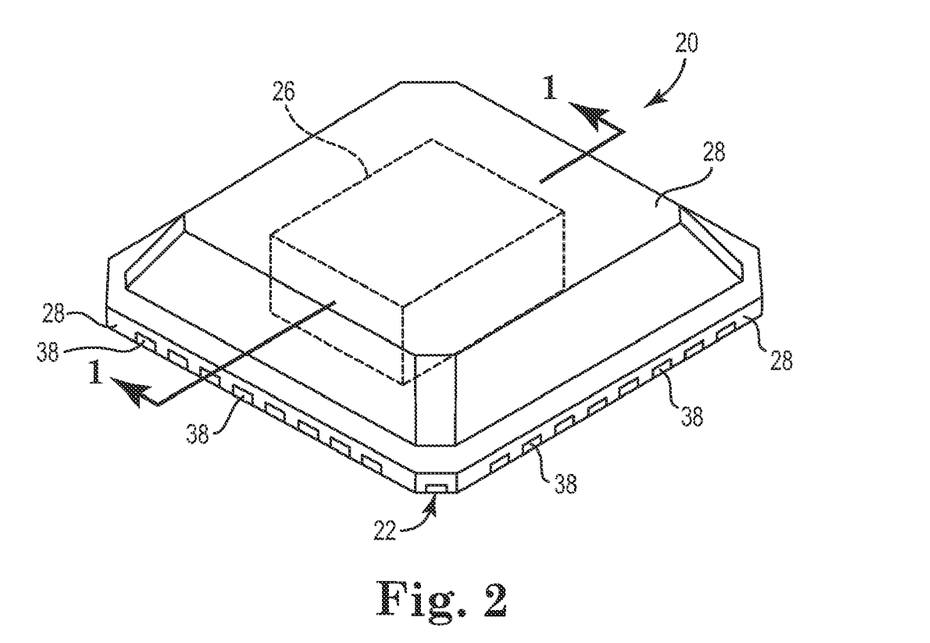
FIG. 2 is a perspective view of the semiconductor device illustrated in FIG. 1 according to one embodiment.
Figure 3:
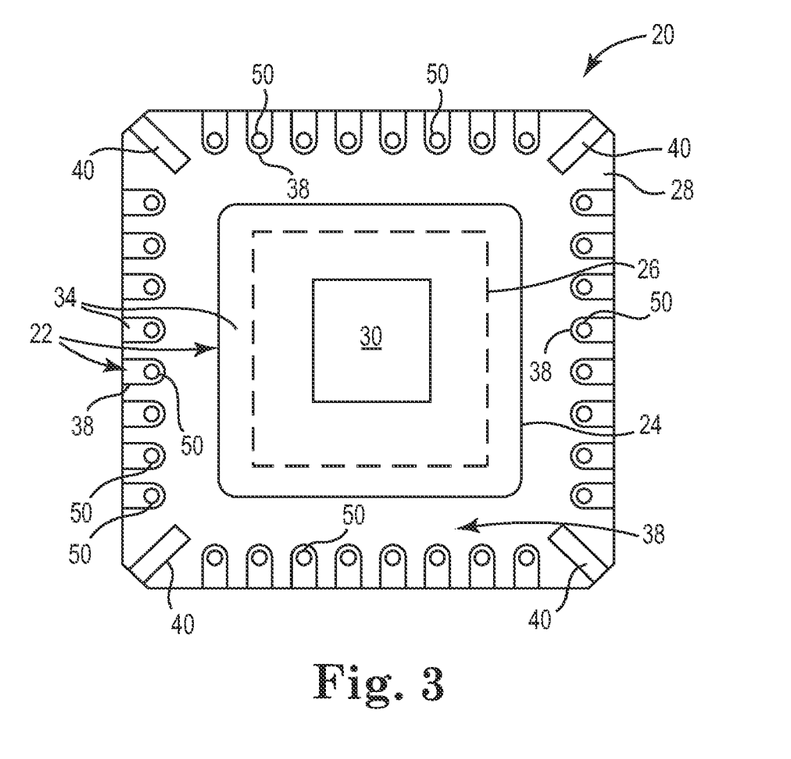
FIG. 3 is a bottom view of the semiconductor device illustrated in FIG. 2 according to one embodiment.

FIG. 2 is a perspective view and FIG. 3 is a bottom view of semiconductor device 20. Encapsulation material 28 covers chip 26 and the first main face 32 (FIG. 1) of leadframe 22. With reference to FIG. 3, leadframe 22 includes chip island 24, contact pads 38, and tabs 40. In one embodiment, metal segments are stamped out of a sheet of metal leaving behind chip island 24 and contact pads 38 of leadframe 22 supported by tabs 40. Typically, multiple leadframes 22 are stamped from the sheet of metal with each leadframe interconnected by tabs 40. FIG. 3 illustrates one such leadframe 22 after fabrication and removal from the sheet of metal and fabricated into semiconductor device 20.

In one embodiment, contact pads 38 are formed along a periphery of chip island 24. In one embodiment, chip island includes cavity 30 and each contact pad 38 is formed to include a frame cavity 50. In one embodiment, second main face 34 provides an exposed exterior face of surface mount semiconductor device 20, and each cavity 30 and the frame cavities 50 are formed in leadframe 22 on the exposed second main face 34.

Figure 4:
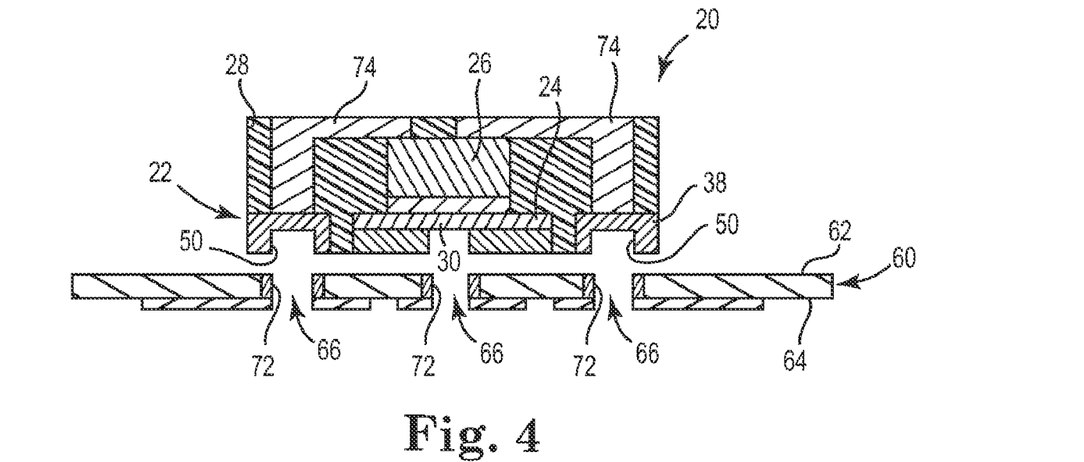
FIG. 4 and FIG. 5 are schematic cross-sectional views of the semiconductor device illustrated in FIG. 1 aligned with and attached to a circuit board, respectively, according to one embodiment.
Figure 5:
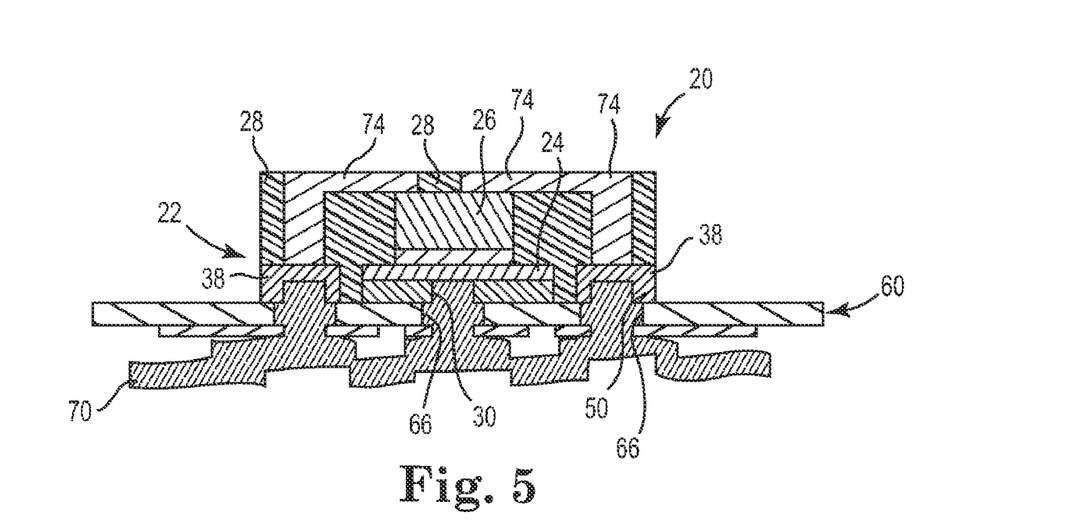

FIG. 4 is a schematic cross-sectional view of semiconductor device 20 aligned for attachment to a board 60, and FIG. 5 is a schematic cross-sectional view of semiconductor device 20 attached to board 60 according to one embodiment. Board 60 includes substrates, printed circuit boards, or carriers having a first main face 62 opposite a second main face 64 and one or more through-openings 66 extending between first and second main faces 62, 64 of board 60. In one embodiment, one of the through-openings 66 aligns with cavity 30 formed in chip island 24 and the other through-openings 60 align with each of the frame cavities 50.

After aligning semiconductor device 20 with board 60, solder 70 is introduced into the through-openings 66 to fill cavities 30, 50 as illustrated in FIG. 5. In one embodiment, solder 70 is applied as wave solder that fills the through-openings 66 and the cavities 30, 50 to form an interconnect between device 20 and board 60. In one embodiment, solder 70 is applied in liquid form (e.g., melted solder) and follows a wetting and heat flow path that results in solder 70 filling cavities 30, 50 and through-openings 66. Cooling/solidifying solder 70 results in a durable electrical interconnect formed between semiconductor device 20 and board 60.

Suitable solder materials include tin solder and solders formed of alloys of tin or other suitable solders.

In one embodiment, each through-opening 66 of board 60 is coated with a layer of solder 72 that is configured to facilitate solder attachment of device 20 and board 60. After the interconnection is formed, chip 26 communicates with board 60 through chip island 24 and through the interconnection established by the solder disposed in cavity 30. In one embodiment, clips 74 attach chip 26 to leadframe 22 such that chip 26 connects with contact pads 38. Other suitable connectors are also acceptable for attaching chip 26 to contact pads 38 of leadframe 22.

Figure 6:
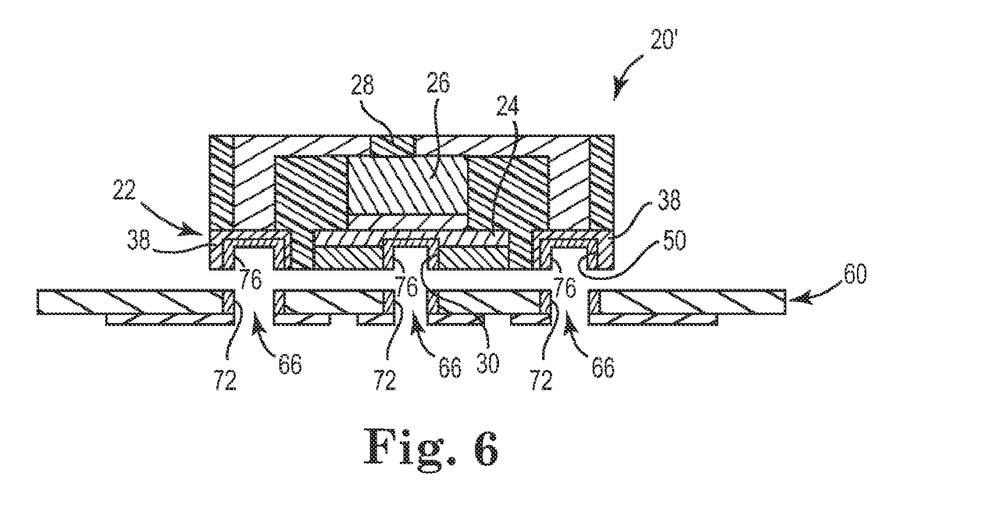
FIG. 6 and FIG. 7 are schematic cross-sectional views of another embodiment of a semiconductor device including solder plated cavities formed on a bottom surface, the device aligned with and attached to a circuit board, respectively, according to one embodiment.
Figure 7:
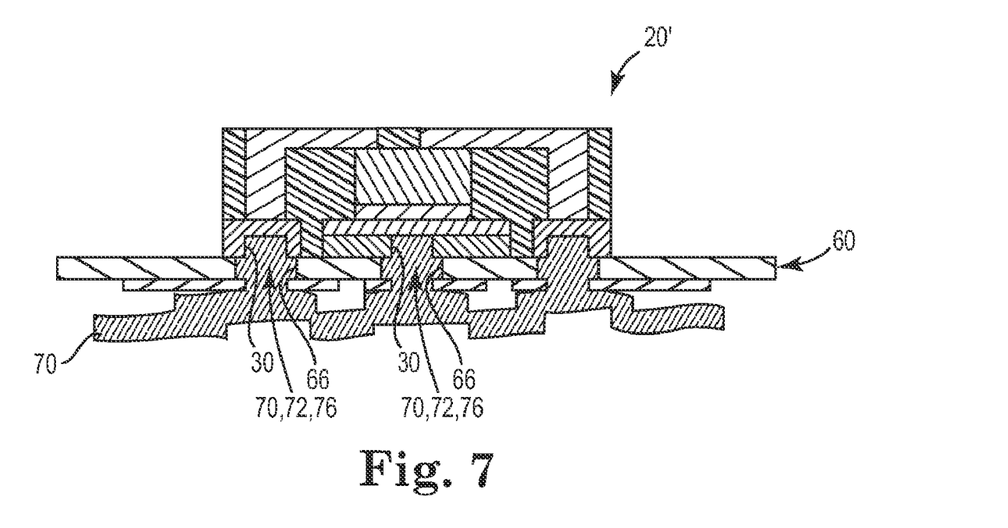

FIG. 6 is a schematic cross-sectional view of another embodiment of a semiconductor device 20' aligned for attachment to board 60, and FIG. 7 is a schematic cross-sectional view of semiconductor device 20' attached to board 60. In one embodiment, semiconductor device 20' includes solder 76 applied over the surface of cavity 30 and over the surface of cavity 50. In this manner, cavity 30 and frame cavities 50 provide additional solder material that ensures attachment of semiconductor device 20' to board 60 without voids or air pockets being formed during soldering.

With reference to FIG. 7, solder 70 is flowed into through-openings 66 and cavities 30, 50, which melts solder 72 and solder 76 to form a mingled plug of solder 70, 72, 76 configured to attach semiconductor device 20' to board 60.

Figure 8:
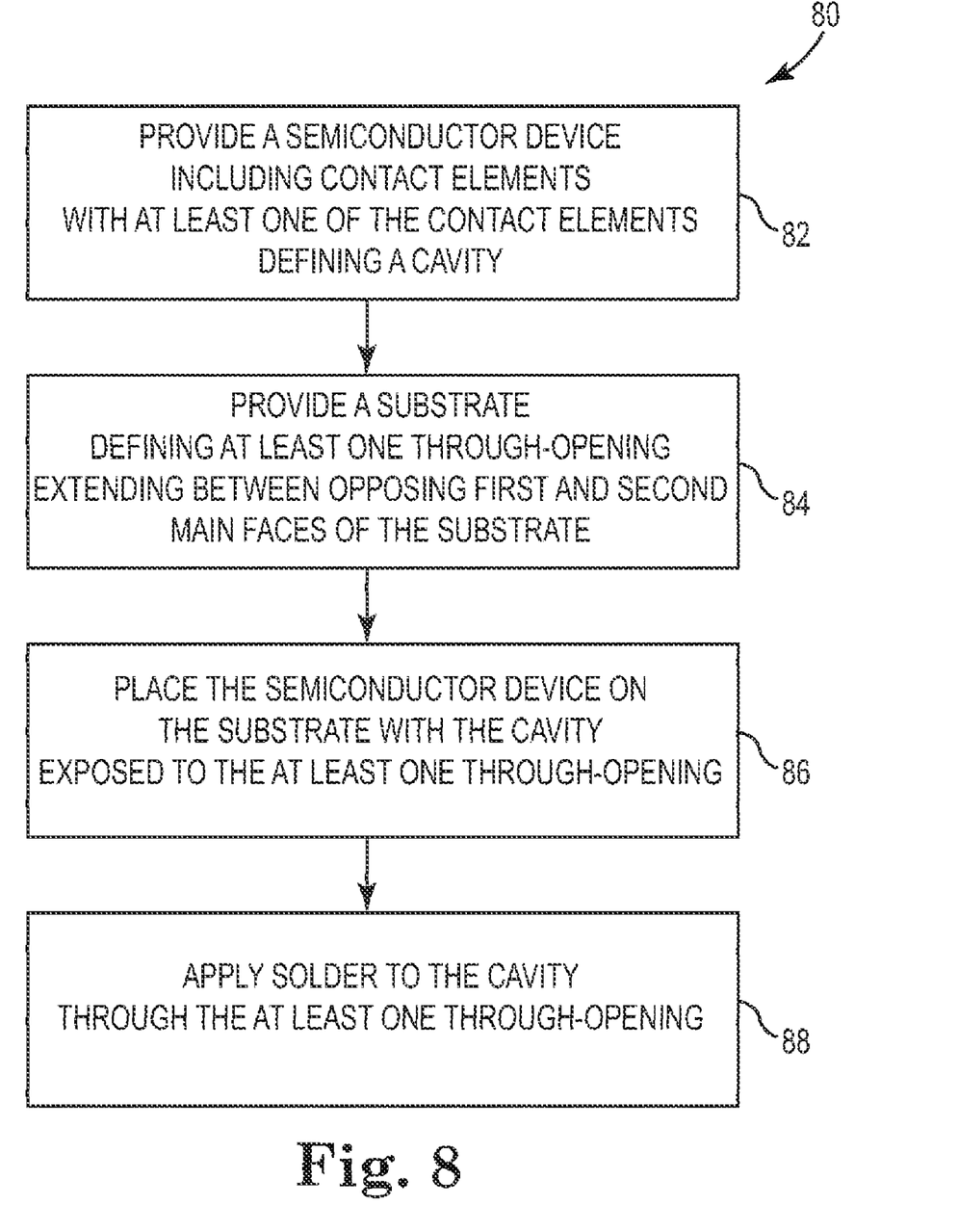
FIG. 8 is a block diagram of a process for assembling semiconductor components according to one embodiment.

FIG. 8 is a block diagram of a process 80 for assembling semiconductor components according to one embodiment. Process 80 includes providing a semiconductor device having contact elements with at least one of the contact elements defining a cavity at 82. At 84, process 80 includes providing a substrate defining at least one through-opening extending between opposing first and second main faces of the substrate. At 86, process 80 includes placing the semiconductor device on the substrate with the cavity exposed to one of the through-openings. At 88, solder is applied to the cavity through the through-opening.

Figure 9A:
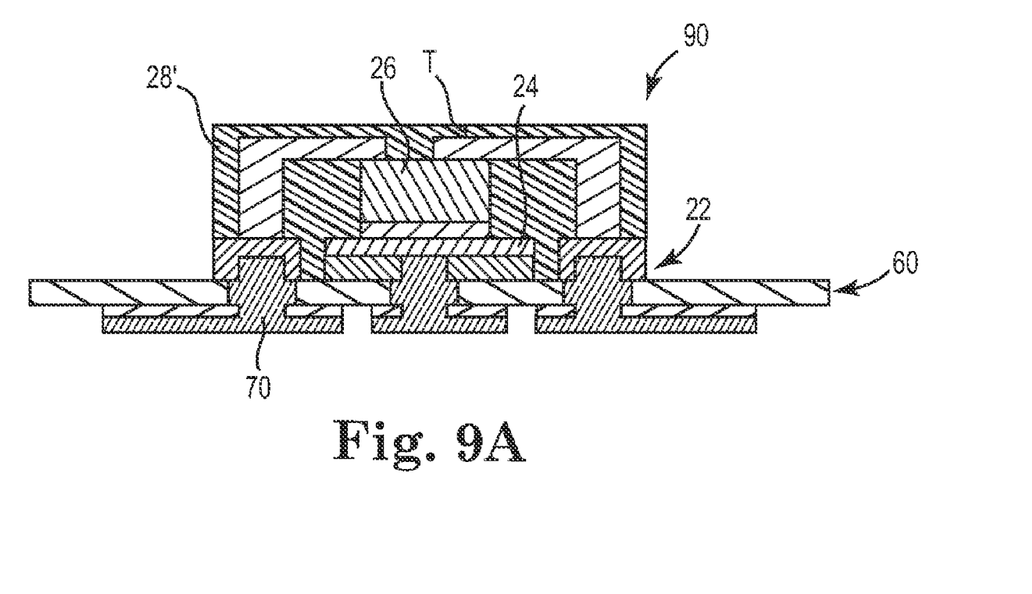
FIG. 9A is a schematic cross-sectional view of another embodiment of a semiconductor device according to one embodiment.

FIG. 9A is a schematic cross-sectional view of a semiconductor device 90 according to one embodiment. Semiconductor device 90 is similar to device 20 and includes chip 26 connected to chip island 24 of leadframe 22. In one embodiment, encapsulation material 28' is deposited over chip 26 and its connecting components to have and additional thickness T that is suited to receive a heat spreading element.

Figure 9B:
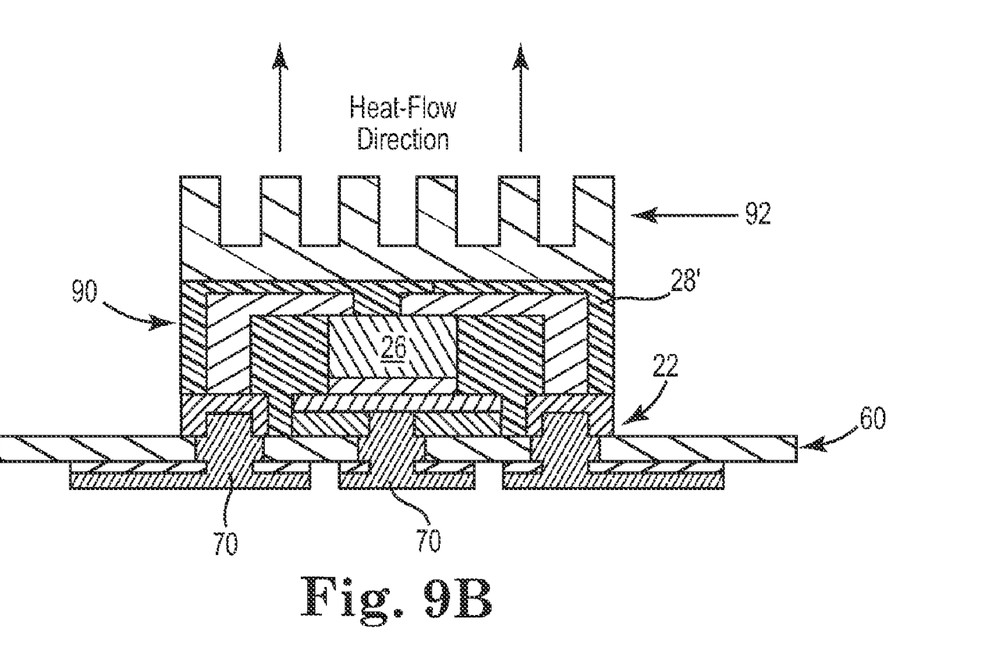
FIG. 9B is schematic cross-sectional view of the semiconductor device illustrated in FIG. 9A including a heat sink element attached to the semiconductor device.

FIG. 9B is a schematic cross-sectional view of semiconductor device 90 including a heat sink element 92 attached to a top surface of device 90. In one embodiment, heat sink element is provided as a metal heat spreader having one or more fins configured to dissipate heat in the heat flow direction. Suitable heat sink elements 92 include metal heat spreaders formed of aluminum, copper, alloys of aluminum, alloys of copper, or other metals.

Figure 10:
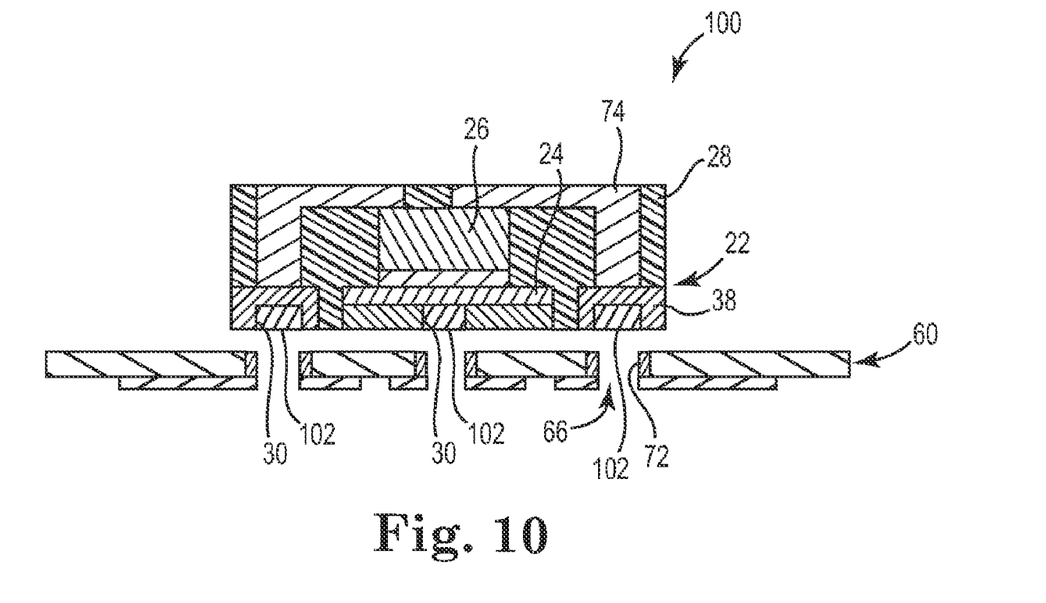
FIG. 10 is a schematic cross-sectional view of a semiconductor device including solder-filled cavities formed in a bottom surface of a leadframe according to one embodiment.

FIG. 10 is a schematic cross-sectional view of a semiconductor device 100 according to one embodiment. Semiconductor device 100 is similar to semiconductor device 20' (FIG. 6) and includes a leadframe 22 formed to include a cavity 30 on chip island 24 and cavities 50 on contact pads 38. In one embodiment, cavities 30, 50 are filled with solder 102 to facilitate attachment of semiconductor device 100 to board 60. During attachment, cavities 30, 50 are aligned with through-openings 66. Introducing solder into through-opening 66 melts and re-flows solder 102 and solder 72 to ensure that an intimate connection is made between device 100 and board 60.

Figure 11:
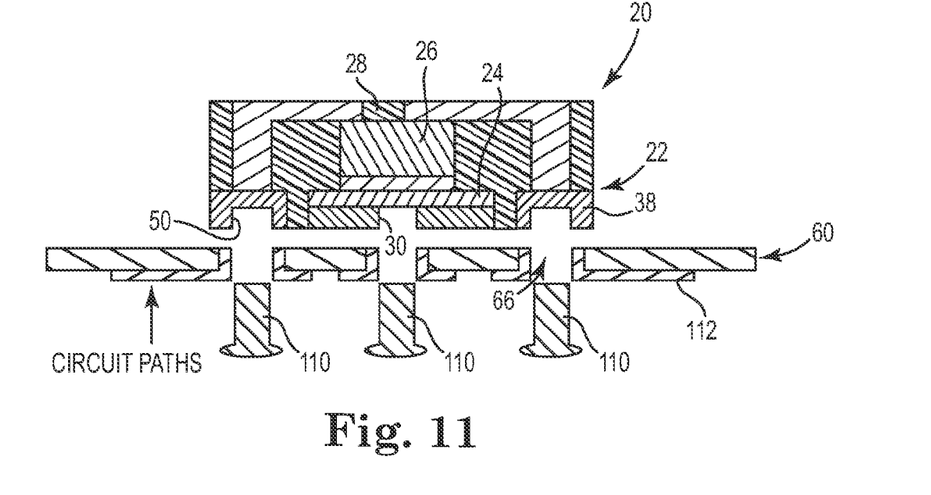
FIGS. 11-13 are schematic cross-sectional views of various embodiments of semiconductor devices configured for attachment to a circuit board with attachment pins.
Figure 12:
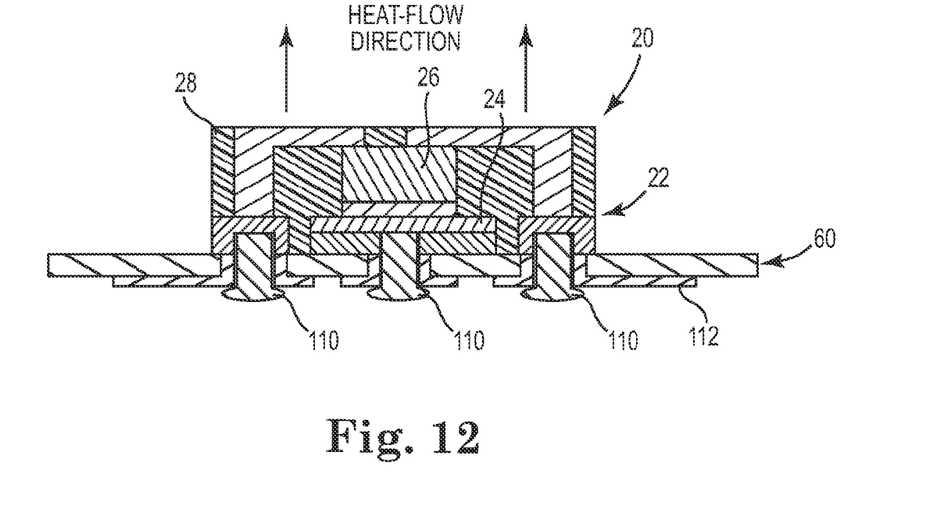
Figure 13:
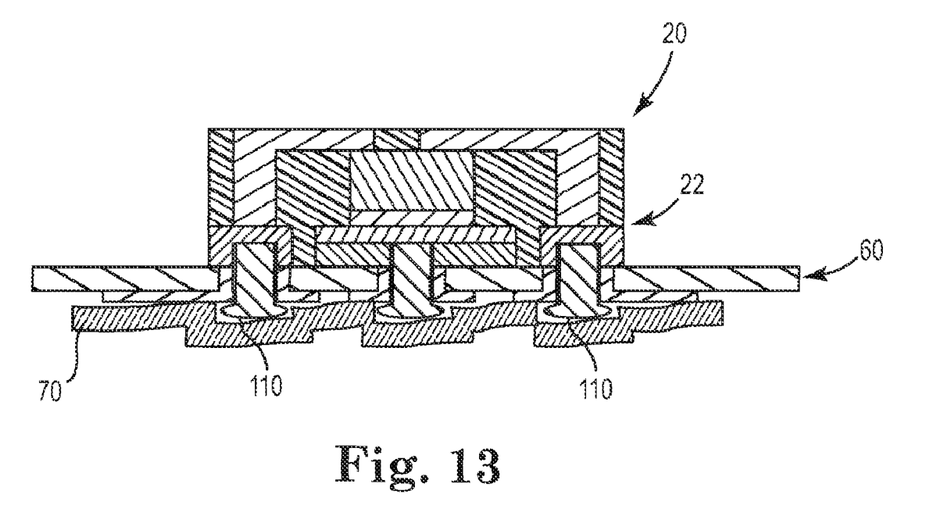

FIGS. 11-13 are schematic cross-sectional views of pins 110 employed to connect semiconductor device 20 to board 60 according to one embodiment.

FIG. 11 is a schematic cross-sectional view of semiconductor device 20 aligned over board 60 such that cavities 30, 50 align with through-openings 66. Pins 110 are positioned to be press-fit into through-openings 66 to form a connection between a metallized layer 112 of board 60 and cavities 30, 50 in leadframe 22.

FIG. 12 is a schematic cross-sectional view of pins 110 press-fit into through-openings 66 and into cavities 30, 50 to connect device 20 to board 60. In one embodiment, metal layer 112 connected to board 60 defines a circuit path along board 60 that communicates with semiconductor device 20.

In one embodiment, the size of the cavities 30, 50 is selected to enable pins 110 to be press-fit and frictionally couple device 20 to board 60.

FIG. 13 is a schematic cross-sectional view of solder 70 deposited over a backside of board 60 attached to device 20. In one embodiment, solder 70 is applied in a pressure and temperature controlled process to deposit solder 70 into connection with pins 110, board 60, and device 20. One suitable pressure and temperature controlled process includes wave soldering employed to deposit solder into the interstices between pins 110, board 60, and cavities 30, 50 of leadframe 22.

Figure 14:
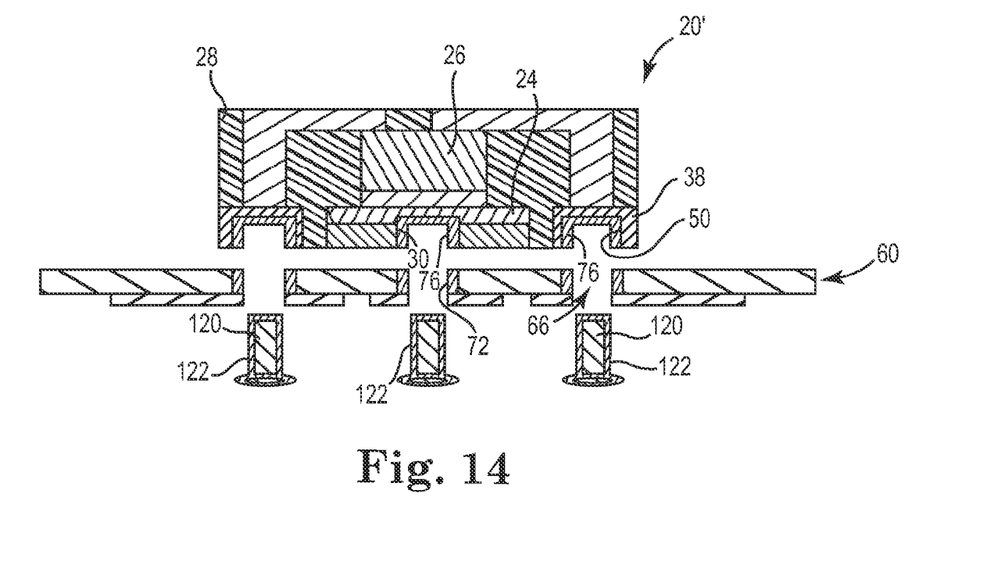
FIG. 14 is a schematic cross-sectional view of a semiconductor device including cavities partially filled with solder material, a circuit board including through-openings partially filled with solder material, and pins coated with solder material and configured to attach the semiconductor device to the circuit board according to one embodiment.

FIG. 14 is a schematic cross-sectional view of semiconductor device 20' aligned for connection with board 60 through the application of press-fit pins 120. In one embodiment, cavities 30, 50 of semiconductor device 20' are at least partially filled with solder 76 and through-openings 66 of board 60 are coated with a layer of solder 72. In one embodiment, pins 120 include a coating of solder 122. Solder 72, 76, and 122 combine to ensure and establish positive electrical interconnection between device 20' and board 60. In one embodiment, pins 120 are inserted through through-openings 66 and engaged with cavities 30, 50, after which heat is applied to melt the solder 72, 76, 122 causing the solder to flow and form an interconnection between device 20' and board 60. It is to be understood that additional solder, for example in a wave soldering process, could be applied over the pins 120 on the backside of board 60.

Embodiments provide a semiconductor package including cavities formed in a connection surface that facilitate connection of a surface mount semiconductor package to a printed circuit board. In one embodiment, the cavities receive solder that is directed through the board and into the cavities. In another embodiment, the cavities are formed and sized to receive a pin that is press-fit to connect the semiconductor to the board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of manufacturing semiconductor devices including attachment cavities formed on an attachment surface of the device as discussed herein. Therefore, it is intended that this invention be limited only by the claims and the equivalents thereof.

What is claimed is:

1. A semiconductor device comprising:
a substrate comprising a chip island, the chip island comprising a first main face opposite a second main face;
a chip attached to the first main face of the chip island; and
encapsulation material deposited on the chip and the first main face of the chip island;
wherein the second main face of the chip island defines at least one cavity, and
wherein the substrate comprises a first major face opposite a second major face, and the second major face defines at least one frame cavity configured to receive attachment material configured for connecting the semiconductor device to a printed circuit board.

2. The semiconductor device of claim 1, wherein the substrate comprises a leadframe.

3. The semiconductor device of claim 2, wherein each cavity and frame cavity comprises a cavity surface and solder disposed over the cavity surface.

4. The semiconductor device of claim 3, wherein the solder fills each of the cavity and the frame cavity.

5. The semiconductor device of claim 1, further comprising a heat sink element connected to the semiconductor device opposite the substrate.

6. A semiconductor device comprising:
a substrate comprising a chip island, the chip island comprising a first main face opposite a second main face;
a chip attached to the first main face of the chip island; and
encapsulation material deposited on the chip and the first main face of the chip island;
wherein the second main face of the chip island defines at least one cavity,
wherein the substrate comprises a leadframe comprising a first major face opposite a second major face, and the second major face defines at least one frame cavity, and
wherein each cavity and frame cavity is sized to receive a pin that is configured to attach the leadframe to a board.

7. The semiconductor device of claim 6, wherein the pin comprises a solder plated pin.

8. A semiconductor package comprising:
a leadframe comprising a contact pad and a chip island each extending between opposing first and second main faces of the leadframe;
a chip attached to the chip island on the first main face of the leadframe;
encapsulation material disposed over the chip and a portion of the first main face of the leadframe; and
a plurality of contact pads disposed around a periphery of the chip island, each contact pad comprising a board surface exposed on the exterior surface of the semiconductor package and defining a cavity,
wherein the second main face of the leadframe comprises an exterior surface of the semiconductor package and defines at least one cavity.

9. The semiconductor package of claim 8, wherein the at least one cavity is at least partially filled with solder.

10. The semiconductor package of claim 8 further comprising a heat sink element connected to an upper exterior surface of the semiconductor package opposite the leadframe.

11. A semiconductor package comprising:
a leadframe comprising a contact pad and a chip island each extending between opposing first and second main faces of the leadframe;
a chip attached to the chip island on the first main face of the leadframe; and
encapsulation material disposed over the chip and a portion of the first main face of the leadframe;
wherein the second main face of the leadframe comprises an exterior surface of the semiconductor package and defines at least one cavity, and
wherein the second main face of the leadframe comprises a package electrode defining multiple cavities configured to receive attachment material configured for connecting the semiconductor package to a printed circuit board.

12. A semiconductor package configured for attachment to a circuit board, the semiconductor package comprising:
a substrate comprising an exterior surface of the semiconductor package;
a chip attached to the substrate; and
encapsulation material disposed over the chip and a portion of the substrate,
wherein the substrate comprises multiple contact pads spaced apart from a chip island to which the chip is attached, each of the multiple contact pads and the chip island defining a cavity on the exterior surface of the semiconductor package, and
wherein the circuit board defines through-openings extending between opposing first and second main faces of the circuit board configured to align with cavities on the exterior surface of the semiconductor package.

13. The semiconductor package of claim 12, further comprising:
a pin configured to extend through one of the through-openings of the circuit board and into a respective one of the cavities of the semiconductor package.

14. The semiconductor package of claim 12, wherein each cavity on the exterior surface of the semiconductor package is at least partially filled with solder.

15. The semiconductor package of claim 12, wherein each cavity on the exterior surface of the semiconductor package is filled with solder.

* * * * *